(12) United States Patent
Hafeez et al.

(10) Patent No.: US 8,205,140 B2
(45) Date of Patent: Jun. 19, 2012

(54) METHOD AND APPARATUS FOR THE USE OF NETWORK CODING IN A WIRELESS COMMUNICATION NETWORK

(75) Inventors: Abdulrauf Hafeez, Cary, NC (US); Dayong Chen, Cary, NC (US); Dennis Hui, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1440 days.

(21) Appl. No.: 11/746,920

(22) Filed: May 10, 2007

(65) Prior Publication Data

US 2008/0279182 A1 Nov. 13, 2008

Related U.S. Application Data

(63) Continuation-in-part of application No. 11/746,679, filed on May 10, 2007, now Pat. No. 8,024,633.

(51) Int. Cl.
*H03M 13/00* (2006.01)
(52) U.S. Cl. ........................................ 714/776
(58) Field of Classification Search .................... 714/776
See application file for complete search history.

(56) References Cited

U.S. PATENT DOCUMENTS

| | | | | |
|---|---|---|---|---|
| 6,151,696 | A * | 11/2000 | Miller et al. | 714/748 |
| 7,397,759 | B2 * | 7/2008 | Tan et al. | 370/216 |
| 2006/0291440 | A1 | 12/2006 | Hausl et al. | |
| 2007/0011600 | A1 | 1/2007 | Johannesson et al. | |
| 2008/0148131 | A1 * | 6/2008 | Hughes et al. | 714/776 |
| 2010/0050027 | A1 * | 2/2010 | Marr et al. | 714/701 |

FOREIGN PATENT DOCUMENTS

WO 00/24153 4/2000

OTHER PUBLICATIONS

S. Zhang, et al., Joint Design of Network Coding and Channel Decoding for Wireless Networks. Wireless Communications and Networking Conference, 2007. WCNC 2007. IEEE, pp. 779-784, Mar. 11-15, 2007, Section III-C.
Chase, D. "Code Combining—A Maximum-Likelihood Decoding Approach for Combining an Arbitrary Number of Noisy Packets." IEEE Transactions on Communications, vol. COM-33, No. 5, pp. 385-393. May 1985.
Larsson. P. et al. "Coded Bi-directional Relaying " 63rd IEEE Vehicular Technology Conference, vol. 2, Spring 2006, pp. 851-855.
Jolfael M. A. et al. "Improved Selective Repeat ARQ Schemes for Data Communications." Proceedings of the IEEE Vehicular Technology Conference, pp. 1407-1411, 1994.

* cited by examiner

*Primary Examiner* — Scott Baderman
*Assistant Examiner* — Enam Ahmed
(74) *Attorney, Agent, or Firm* — Coats & Bennett, P.L.L.C.

(57) ABSTRACT

According to a method and apparatus taught herein, a network node includes a receiver circuit that determines soft values for received packets corresponding to the information bit groups associated with network coding operations, where the soft values are determined for each information bit group based on joint probabilities of the information bits within the information bit group. For example, first soft values are determined for the information bit groups in a first (received) constituent packet and second soft values are likewise determined for the information bit groups in a network-coded (received) packet that depends on the first constituent packet and a second constituent packet. Third soft values are generated for the information bit groups of the second constituent packet based on jointly evaluating the first and second soft values.

26 Claims, 6 Drawing Sheets

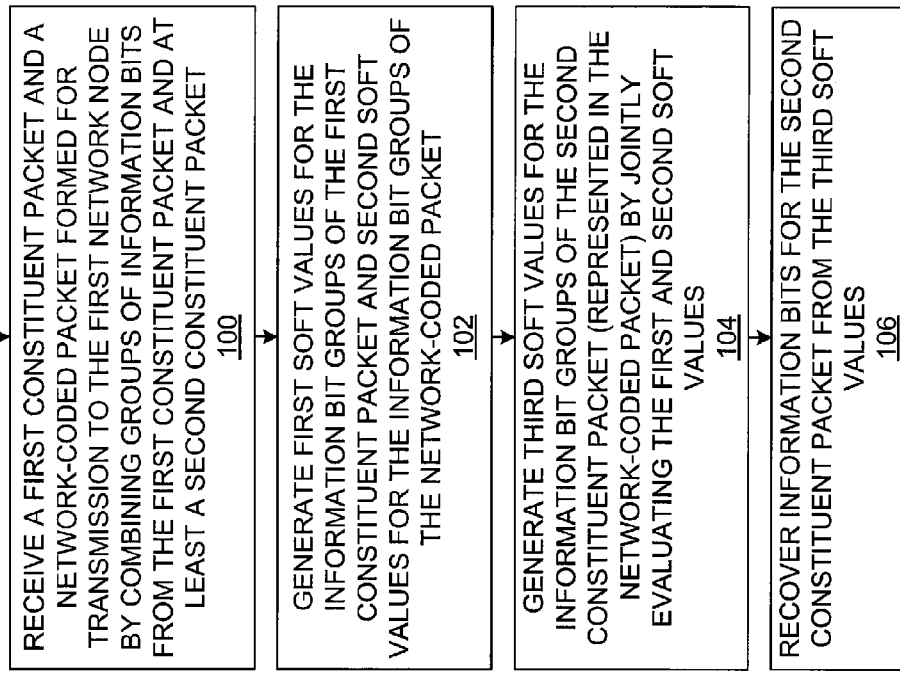
FIG. 3
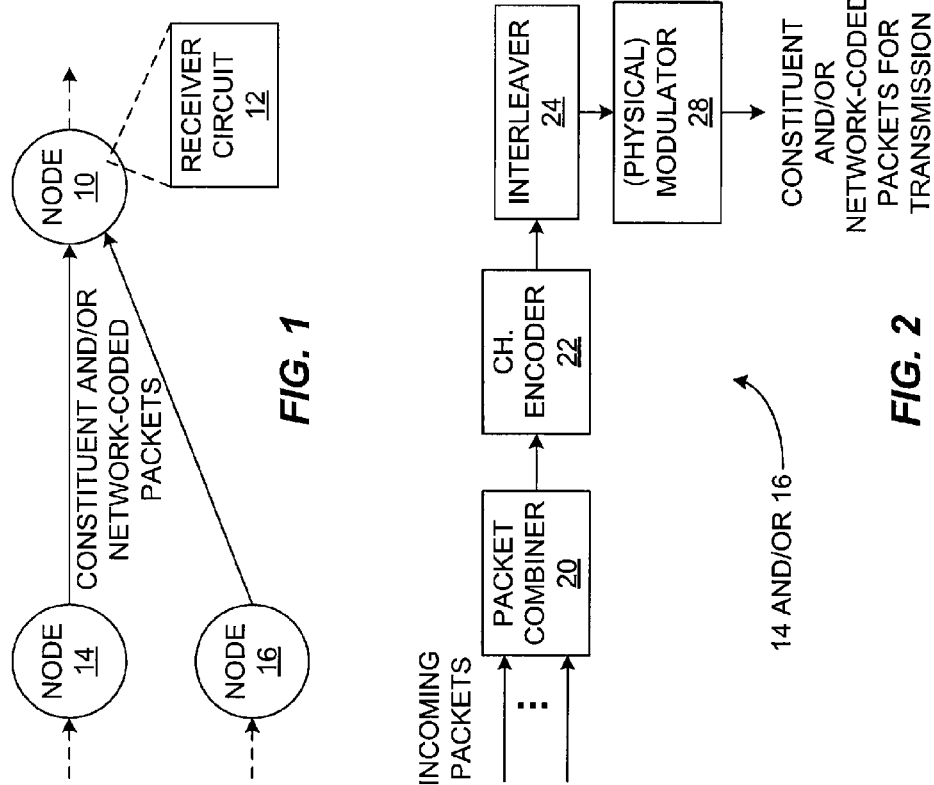
FIG. 1
FIG. 2

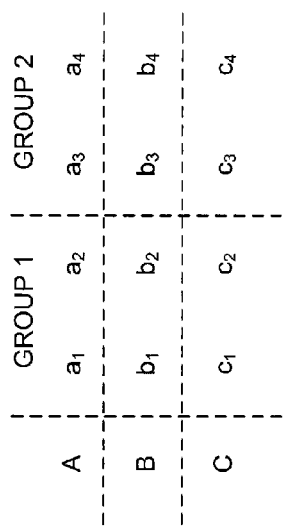
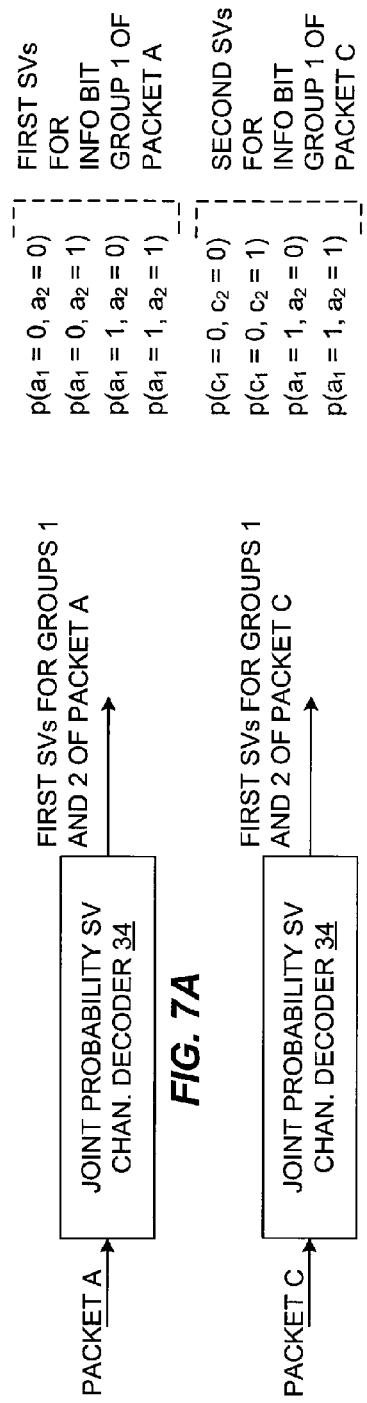
A = EXPLICITLY TRANSMITTED/RECEIVED CONSTITUENT PACKET
C = EXPLICITLY TRANSMITTED/RECEIVED NETWORK-CODED PACKET FORMED FROM A AND B
B = IMPLICITLY TRANSMITTED/RECEIVED CONSTITUENT PACKET
FIG. 6
FIG. 7A
FIG. 7B
FIG. 8

METHOD AND APPARATUS FOR THE USE OF NETWORK CODING IN A WIRELESS COMMUNICATION NETWORK

RELATED APPLICATIONS

This application claims priority under 35 U.S.C. §120 as a continuation-in-part of the earlier filed and co-pending patent application, which is entitled "METHOD AND APPARATUS FOR COMBINED PACKET RETRANSMISSION AND SOFT DECODING OF COMBINED PACKETS IN A WIRELESS COMMUNICATION NETWORK," as filed on 10 May 2007 and assigned application Ser. No. 11/746,679 now U.S. Pat. No. 8,024,633.

BACKGROUND

1. Technical Field

The present invention generally relates to communication networks, such as wireless communication networks, and particularly relates to the use of network coding in such networks.

2. Background

"Network coding" provides a technique for achieving maximum-flow through one or more intermediate nodes routing data from a given number of information sources to a given number of information sinks. Rather than routing independent data packets, network coding mixes data packets at one or more of the intermediate nodes by forming combinations of individual data packets, where the individual packets used to form a given network-coded packet are "constituent" packets of that network-coded packet. Much practical and theoretical work has involved network coding. See, for example, R. Ahlswede, N. Cai, S. R. Li, and R. W. Yeung, "Network information flow," IEEE Transactions on Information Theory, July 2000. See also C. Fragouli, et al., "Network Coding: An Instant Primer."

SUMMARY

According to a method and apparatus taught herein, a network node uses joint probability processing in decoding network-coded packets, wherein soft values for the bit groupings represented in the network-coded packets and their related constituent packets are obtained from a channel decoding process. Such processing, with its exploitation of the "relatedness" of bits within the bit groupings (information bit groups) used to form network-coded packets, employs joint probability processing for decoding network-coded packets with improved reliability. As a non-limiting example, such reliability improvements offer throughput and efficiency advantages in wireless communication networks, wherein channel-encoded packets are sent over noisy transmission channels.

In one embodiment, a method of packet decoding at a first network node comprises receiving a first constituent packet and a network-coded packet formed for transmission to the first network node by combining information bit groups from the first constituent packet with information bit groups from at least a second constituent packet. The method continues with generating first soft values for the information bit groups of the first constituent packet and second soft values for corresponding information bit groups of the network-coded packet based on joint probabilities of information bits within each information bit group of the first constituent packet and the network-coded packet, respectively. Third soft values for the information bit groups of the second constituent packet are generated based on jointly evaluating the first and second soft values, and deriving information bits for the second constituent packet from the third soft values.

The above method and variations of it may be implemented in essentially any network node, in hardware and/or software, where that network node acts as a data sink for received constituent and network-coded packets. Note, however, that in one or more embodiments taught herein, the network node also can act as a data relay, wherein it forwards received packets. Such operation may be particularly advantageous where the node comprises a mobile station, wherein such capability supports its use as a node in ad hoc communication networks.

Of course, the present invention is not limited to the above contexts, nor is it limited to the above features and advantages. Indeed, those skilled in the art will recognize additional features and advantages upon reading the following detailed description, and upon viewing the accompanying drawings.

BRIEF DESCRIPTION OF THE DRAWINGS

FIG. 1 is a block diagram of one embodiment of a communication network including several nodes, and particularly including a node having a receiver circuit configured for joint probability processing of network-coded packets as taught herein.

FIG. 2 is a block diagram of one embodiment of functional circuit elements for network coding at one or more of the nodes illustrated in FIG. 1.

FIG. 3 is a logic flow diagram for one embodiment of processing logic that may be implemented by the receiver circuit introduced in FIG. 1, for joint probability processing of network-coded packets.

FIG. 6 is a diagram of example bit groupings for constituent packets as used in the generation of network-coded packets.

FIGS. 7A and 7B are block diagrams of one embodiment of a joint probability soft value channel decoder configured to generate soft values for information bit groups of explicitly received packets, based on, for a given explicitly received packet, the joint probabilities of the information bits within each information bit group of the explicitly received packet.

FIG. 8 is a diagram of soft values representing joint probabilities of information bits for one information bit group of a constituent packet and a related network-coded packet.

DETAILED DESCRIPTION

Figure 4:
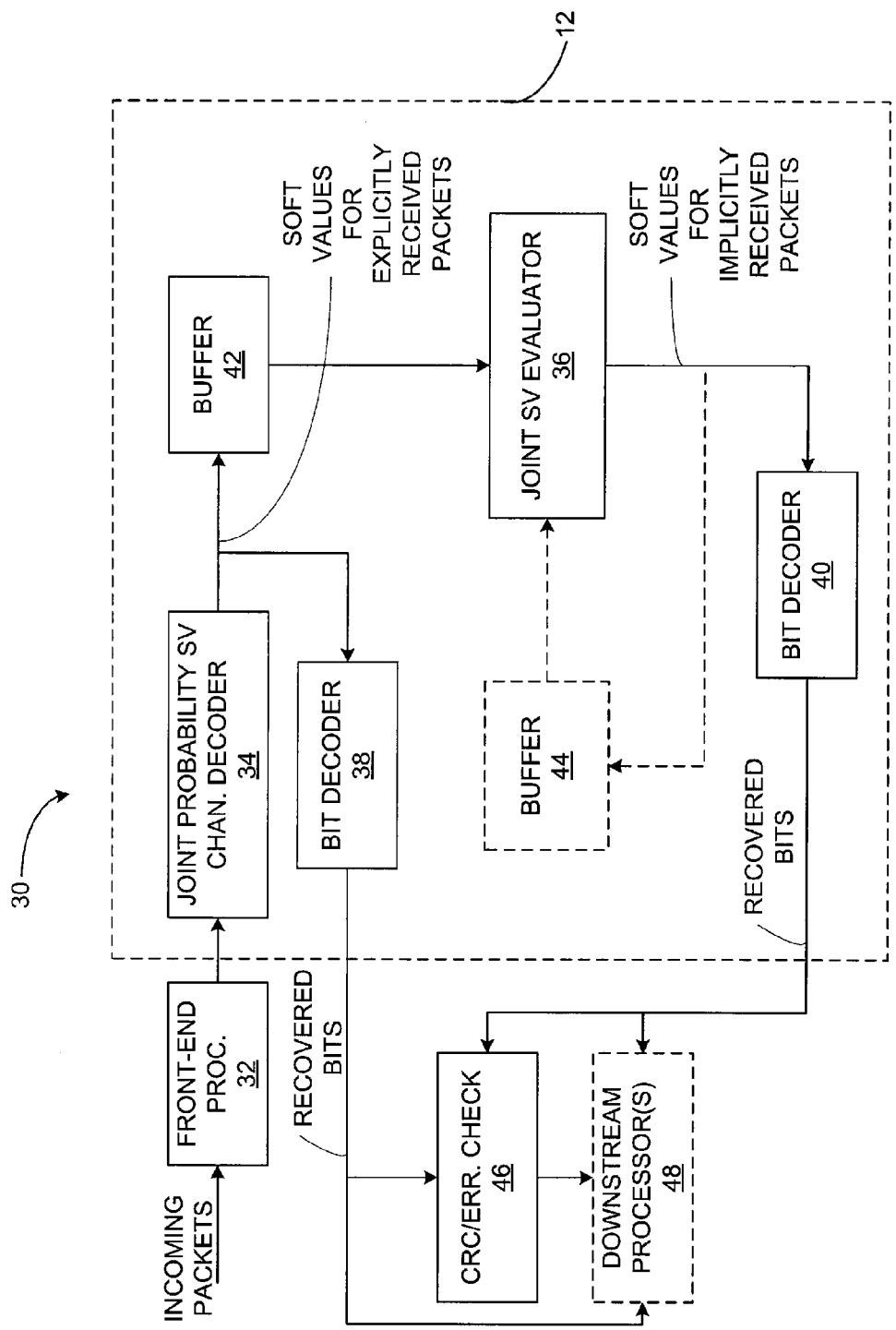
FIGS. 4 and 5 are block diagrams of a receiver, which may be a wireless communications receiver, that includes different embodiments of a receiver circuit configured for joint probability processing of network-coded packets.

FIG. 1 generically illustrates a (network) node 10 that includes one embodiment of a receiver circuit 12 that is configured for joint probability processing of network-coded packets as taught herein. In more detail, the node 10 receives "constituent" packets and/or network-coded packets from one or both of upstream nodes 14 and 16. In general, each packet contains information bits, which may be in channel-encoded/interleaved form. Further, in this context, a constituent packet represents a packet of information bits used to form a network-coded packet. Thus, a constituent packet may represent an "original" packet of information bits conveyed through the network of nodes, or itself may represent a previously generated network-coded packet that is combined again with one or more other constituent packets to form a new network-coded packet.

In any case, in operation the node 10 generally receives a mix of constituent packets and related network-coded packets, where a network-coded packet is related to the constituent packets from which it is formed. For clarity, the receipt of a network-coded packet at the node 10 effectively amounts to the implicit receipt of the constituent packets represented in the network-coded packet. Thus, one may regard node 10 as receiving explicit constituent packets, which are not network-coded combinations of other packets, and implicit constituent packets as represented in the form of explicitly received network-coded packets.

The node 10 uses the explicitly received constituent and their related network-coded packets to recover the implicitly received constituent packets. For example, assume that the node 10 receives Packet A as an explicitly-received constituent packet, and Packet A+B as a related network-coded packet. Thus, the receiver circuit 12 uses Packet A and Packet A+B, plus its knowledge of the combining operation used to form Packet A+B, to recover Packet B based on joint probability decoding of Packet A and Packet A+B. Therefore, one may say that Packet B represents an implicitly received constituent packet.

FIG. 2 illustrates one embodiment of functional circuit details implemented at one or both of the transmitting nodes 14 and 16, which provide for the formation of network-coded packets, such as the Packet A+B discussed above. In more detail, one sees a packet combiner 20, which may be configured to form network-coded packets as linear combinations of incoming constituent packets, where such combinations are formed over a finite field. In more detail, with network coding, packets are combined at the information bit level rather than at the code bit or modulation symbol level, as would be done in hybrid ARQ. Subsets of adjacent information bits in a given packet are grouped together into information bit groups, which may be regarded as symbols comprising subsets of the information bits in the packet. With that approach, corresponding information bit groups—e.g., corresponding "symbols"—from two or more constituent packets are linearly combined over a finite field to form network-coded packets.

A channel encoder 22 channel-encodes the network-coded packets, and an interleaver 24 interleaves the channel-encoded information bits of the network-coded packets for further transmission robustness, and the encoded/interleaved information bits are modulated onto a physical carrier by the modulator 28 for transmission to the node 10. Those skilled in the art will appreciate that these transmission processing steps are, at least to some extent, dependent on the characteristics of the channel over which the packets will be sent, and therefore at least some of these implementation details may be varied or omitted depending upon the particular context.

Generally, the node 10 receives a mix of constituent packets and network-coded packets from one or more given upstream nodes. For example, during any given transmission time period, it receives a constituent packet from one upstream node and a network-coded packet from another upstream node. Reception in this manner allows the node 10 to receive at least two packets worth of information at the same time-one explicit constituent packet and one implicit constituent packet represented in the network-coded packet.

The joint probability processing mentioned in the earlier example of decoding constituent Packet A and its related network-coded Packet A+B is of particular interest herein. That is, the receiver circuit 12 uses joint probability processing for improved performance in the recovery of implicit constituent packets. In a first sense, this joint probability processing exploits the "relatedness" of the information bits within the information bit groups of explicitly received packets. Further, as will be explained in more detail later herein, joint probability processing also exploits the additional information gained by looking at corresponding probabilities of information bit groups for constituent and related network-coded packets point evaluation) when recovering implicitly received constituent packets.

FIG. 3 illustrates one embodiment of processing logic which may be implemented in the receiver circuit 12 of the node 10, for joint probability processing. The processing logic illustrated in FIG. 3 may be implemented in hardware, software, or any combination thereof. For example, the receiver circuit 12 may comprise one or more processors configured to execute program instructions, or configured via hardware programming to carry out the desired processing. In at least one embodiment, the receiver circuit 12 is at least partially implemented in one or more microprocessors or digital signal processors executing program instructions embodying the desired joint probability processing. More particularly, in one or more embodiments, the one or more processing circuits of the receiver circuit 12 comprise one or more microprocessor-based circuits and corresponding stored program instructions. For example, the receiver circuit 12 may comprise a digital signal processor for baseband processing in a radiofrequency communications receiver.

In any case, the illustrated processing begins with the node 10 receiving a first constituent packet and a (related) network-coded packet (Step 100). The network-coded packet is formed for transmission to the node 10 by combining groups of information bits from the first constituent packet and at least one second constituent packet. Thus, the second constituent packet is implicitly received at the node 10 by virtue of its receipt of the corresponding network-coded packet. Note that the first constituent packet and the network-coded packet may be received at the node 10 in the same transmission time (symbol time), or at different times.

Processing continues with the generation of first soft values for the information bit groups of the first constituent packet and second soft values for the information bit groups of the network-coded packet (Step 102). Such processing may be performed as part of a channel decoding process as packets are received, or received packets may be buffered and then processed.

Channel decoding as contemplated herein may be carried out in any number of ways. For example, channel decoding may be performed using maximum a priori (MAP) sequence estimation (which is equivalent to maximum likelihood sequence estimation (MLSE) in the case of a priori equiprobable input sequences) or MAP symbol-by-symbol estimation implemented by a soft-output algorithm such as the BCJR algorithm described, for example, in L. Bahl, J. Cocke, F. Jelinek, and J. Raviv, "Optimal Decoding of Linear Codes for minimizing symbol error rate", IEEE Transactions on Information Theory," (1974). As another example, channel decoding for soft output generation may be based on the use of OSA (optimum-soft-output algorithm), which is discussed in Koppelaar and van Dijk, M., "Symbol by symbol APP decoding with a generalized Viterbi decoder," IEEE Information Theory and Communications Workshop (1999).

Thus, in at least one embodiment, channel decoding as contemplated herein produces soft values corresponding to the information bit groups of explicitly received packets (constituent and network-coded). These soft values may be regarded as "symbols" corresponding to the information bit groups of the explicitly received packets, keeping in mind that the information bit groups represent the groupings of bits associated with the network coding operations, which groups information bits in two or more packets using some finite field F.

Soft values for these symbols are needed for optimum network decoding, and such values can be obtained by using the technique described in A. Khayrallah and G. E. Bottomley, "Joint probability in demodulation and decoding," Conference on Information Sciences and Systems, March 2001. In that paper, the authors obtain joint probabilities for groupings of related bits. See, also, the co-pending and commonly assigned U.S. patent application entitled, "Decoding Method and Apparatus," filed on 13 Jun. 2006 and assigned Ser. No. 11/451,724. That application is now published as U.S. 2007/0011600 A1. Set in the context presented herein, the joint probability processing techniques of the above authors are applied to the information bit groupings defined by the network coding process.

Because network codes generally involve large field sizes, such as $2^8$, in which case eight consecutive bits of a packet are grouped into a symbol for combining, joint probability determinations involving such large, related bit groupings can become computationally challenging, and can require significant amounts of working memory to support the computations. However, the complexity and storage requirements can be reduced by considering only the most likely symbol values, i.e., the symbol hypotheses that have the highest probability. The number of symbol hypotheses can be limited to a fixed number, say M, which may be much smaller than the field size (or symbol alphabet). In this case, only M probabilities would need to be stored per symbol period. However, one would generally store the symbol hypotheses along with the corresponding probabilities, because the most likely symbol hypotheses may be different for every symbol period.

Thus, as a point of computational efficiency, one or more embodiments of joint probability based processing of network-coded packets as taught herein limits complexity by generating soft values for only the most likely symbol hypotheses of the information bit groups in the explicitly received packets. (As will be explained later herein, as an alternative to optimum decoding of the information bit groups, sub-optimum symbol soft values representing the information bit groups of explicitly received packets can be obtained by multiplying the bit soft values of the individual information bits (obtained from soft bit value decoding, for example) with the various symbol hypotheses representing the corresponding information bit groups.)

With these variations in mind, processing continues with the receiver circuit 12 jointly evaluating the first and second soft values to obtain third soft values representing the information bit groups of the implicitly received packet (Step 104)—i.e., the second constituent packet implicitly carried in the network-coded packet. Such joint evaluation may comprise, for example, performing weighted comparisons or combining of corresponding ones of the first and second soft values—i.e., soft values representing corresponding information bit groups of the first constituent packet and the network-coded packet—to exploit the additional information available from the relatedness between the joint probabilities of the corresponding information bit groups.

Processing continues with recovering the information bits of the implicitly received second constituent packet based on decoding the third soft values (Step 106). Note that similar decoding may be done for at least the first soft values, to recover information bits for the first constituent packet. Further, in one or more embodiments, the method further includes receiving a second network-coded packet that depends on the second constituent packet, and using the third soft values along with fourth soft values determined for information bit groups of the second network-coded packet to jointly determine soft values for another constituent packet on which the second network-coded packet depends.

With the above method in mind, FIG. 4 illustrates corresponding functional circuits for one embodiment of the receiver circuit 12, shown in the context of a receiver 30 included in the node 10. The receiver 30 comprises, in addition to an embodiment of the receiver circuit 12, a front-end processor 32 configured to initially process the incoming packets, such as by downconverting and digitizing received wireless communication signals in a wireless communication embodiment. Such processing may include a mix of analog and digital processing and may entail a mix of analog and digital processing circuits, and also may include initial symbol detection/demodulation.

In any case, the illustrated receiver circuit comprises a joint probability soft value channel decoder 34, a joint soft value evaluator 36, one or more bit decoders (38 and 40 are shown), and may include one or more buffers (42 and 44 are shown). The receiver circuit 12 also may include or be associated with an error checking circuit 46, which may perform Cyclic Redundancy Checks (CRCs) for recovered information bits, and provide error notifications to one or more downstream processing circuits 48. The nature and extent of these downstream processing circuits, which may obtain data and/or control information from the recovered information bits, will depend on the implementation of the network node 10. As a non-limiting example, if the node 10 is a mobile station, the downstream processing circuits 48 may include data and control processing circuits, user interface circuits, etc.

In operation, the front-end processor 32 provides signal samples corresponding to explicitly received packets, e.g., a first explicitly received constituent packet and a related, explicitly received network-coded packet. The joint probability soft value channel decoder 34 determines soft values for the information bit groups of each such received packet, where the field size and groupings are defined by the transmit-side network coding operations. That is, for any given explicitly received packet, the joint probability soft value channel decoder 34 generates soft values uses joint probabilities of information bits within each information bit group of the explicitly received packet to generate soft values representing those information bit groups, where the information bit groups are the defined as the groupings used for upstream network coding operations.

In turn, a joint soft value estimator 36 uses the soft values of corresponding information bit groups for explicitly received constituent and related network-coded packets to obtain soft values for the corresponding information bit groups of the constituent packets implicitly carried by the network-coded packets. For example, the soft values of information bit groups of a first constituent packet (explicitly received) processed jointly with the soft values of the corresponding information bit groups of a related network-coded packet. As a non-limiting example, the soft values of information bit groups of an explicitly received constituent packet can be compared to the soft values of corresponding information bit groups of a related, explicitly received network-coded packet to determine weighted values representing the highest probability estimates of soft values for the information bit groups of a second constituent packet represented in the network-coded packet.

The receiver circuit 12 may include bit decoders 38 and 40 to recover individual information bits from the information bit group soft values of explicitly received packets and implicitly received packets, respectively. (Other embodiments use a single decoder.) The receiver circuit also may include one or more buffer circuits (42 and 44 are shown), to buffer soft values for the information bit groups of explicitly and implicitly received packets. Note, too, in at least one embodiment, the soft values jointly determined for an implicitly received packet can be held in buffer 44, for example, for use with soft values for information bit groups of a related network-coded packet in jointly determining soft values for another implicitly received packet.

Figure 5:
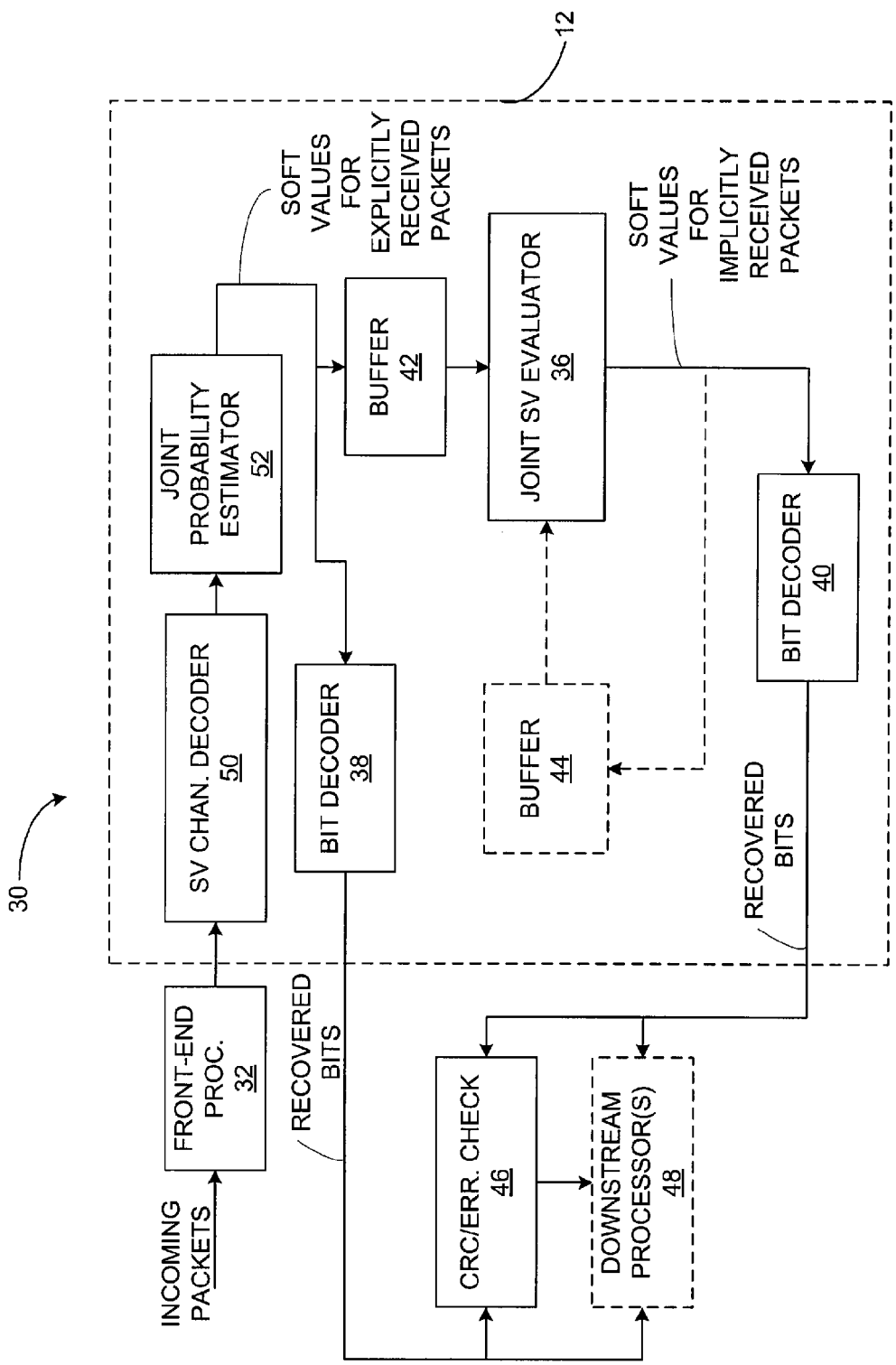

Further, note that FIG. 5 illustrates essentially the same circuits as FIG. 4, but where a soft value channel decoder 50 produces soft values for the information bits of explicitly received packets (rather than for information bit groups). This embodiment thus operates sub-optimally by a joint probability estimator 52, where the information bit group soft values are generated by grouping information bit soft values and multiplying them by symbol hypotheses for the information bit groups.

As an aid to better understanding operation of the receiver circuit 12 in one or more embodiments, FIG. 6 illustrates an example of network coding that is simplified to two information bit groups, Groups 1 and 2, with two information bits per group. In this context, the information bits $a_1$ and $a_2$ of Group 1 in Packet A are combined with the corresponding information bits $b_1$ and $b_2$ of Group 1 in Packet B, to form information bits $c_1$ and $c_2$ representing Group 1 of the network-coded Packet C. Like operations involving the Group 2 bits of Packets A and B are done to form Group 2 of the network-coded Packet C.

FIGS. 7A and 7B illustrates corresponding soft value generation at the receiving network node 10, wherein the joint probability soft value decoder 34 generates first soft values for the information bit groups of (explicitly) received Packet A using the joint probabilities of information bits in each information bit group of Packet A. FIG. 7B illustrates the same processing independently applied to Packet C, wherein second soft values for the (corresponding) information bit groups of the network-coded Packet C are generated. (Two figures are presented for clarity, to show the decoding process separately applied to Packet A and to Packet C, to generate soft values for the information bit groups in each such packet.) FIG. 8 illustrates these soft values for Group 1 of Packets A and C, where it should be understood that the joint probabilities (of bits $a_1$ and $a_2$ for Group 1 of Packet A and bits $c_1$ and $c_2$ for Group 1 of Packet C) can be represented as log-likelihood ratios if desired.

Figure 9:
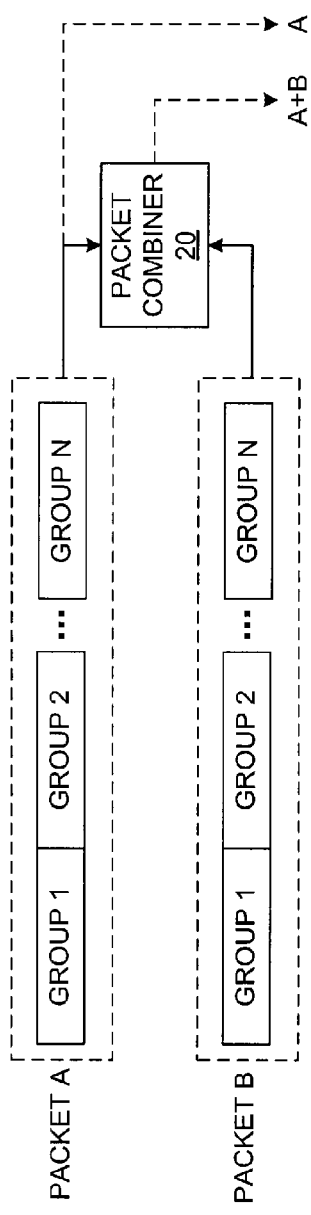
FIGS. 9 and 10 are related block diagrams illustrating one embodiment for grouping of information bits in constituent packets for the formation of a network-coded packet from a transmitting node, and one embodiment of the corresponding joint probability processing of the network-coded packet at a receiving node, based on those related bit groupings.
Figure 10:
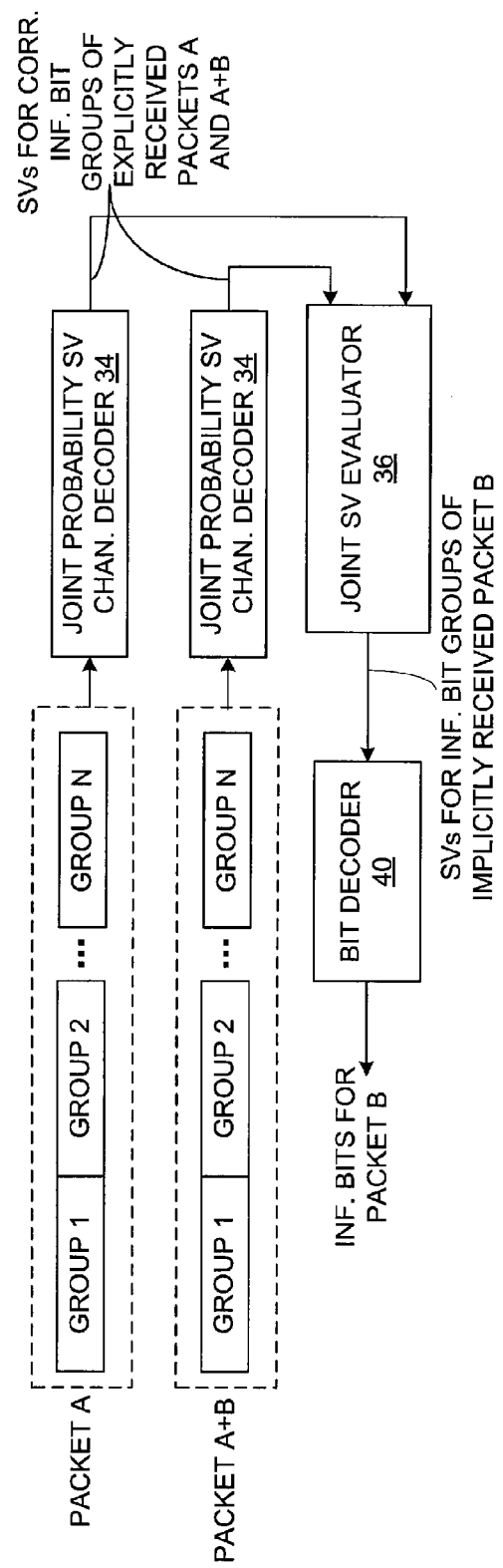

In keeping with the above details, FIGS. 9 and 10 illustrate transmit/receive operations for the more general case of information bit groups 1 . . . N, wherein the packet combiner 20 shown in FIG. 9 for a transmitting node combines corresponding information bit groups for Packet A and Packet B, to form combined packet information bit groups for the network-coded Packet C (shown as A+B by way of non-limiting example). Thus, Packets A and A+B are explicitly transmitted to the receiving node 10, wherein, as shown in FIG. 10, an embodiment of the joint probability soft value channel decoder 34 (or elements 50 and 52 of FIG. 5) produce first soft values for the information bit groups in Packets A. For each information bit group, the joint probability processing uses the joint probabilities of the information bits within each information bit group of the packet being processed, to determine the soft values for the packet's information bit groups. Thus, FIG. 10 illustrates such processing as applied by the joint probability soft value channel decoder 34 to Packet A, and as applied to Packet A+B (e.g., the network-coded Packet C formed from constituent packets A and B). Thus, in addition to determining the first soft values for the information bit groups of Packet A, the joint probability soft value channel decoder 34 determines second soft values for the corresponding information bit groups of Packet A+B.

The joint soft value evaluator 36 in turn processes the first and second soft values jointly to determine third soft values for the information bit groups of the implicitly-received Packet B. For example, the soft values for Group 1 of Packet A are compared to the soft values of Group 1 of Packet A+B, or are otherwise jointly evaluated, to obtain soft values for Group 1 of Packet B. In turn, the soft values of Group 1 derived for Packet B are used by the bit decoder to recover the corresponding information bits of that group. More generally, the process is repeated for all information bit groups of interest.

Figure 11:
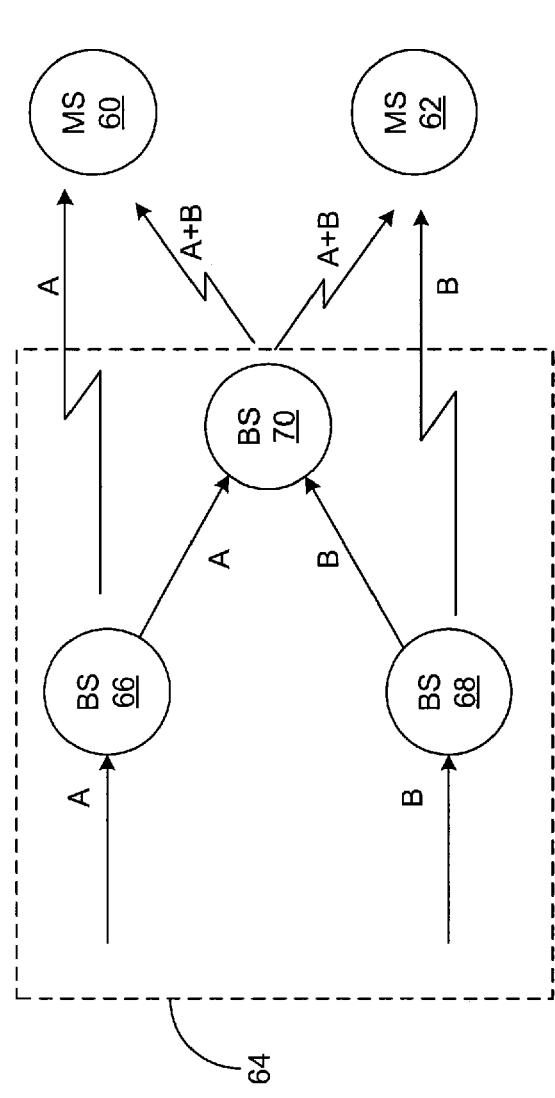
FIG. 11 is a block diagram illustrating an embodiment of joint probability processing of network-coded packets at one or more mobile stations in a wireless communication network.

Using the joint probabilities of information bits within each information bit group of (explicitly received) network-coded and related constituent packets improves the recovery of implicitly received constituent packets, which provides greater communication efficiency by increasing throughput, reducing errors, etc. These advantages offer benefits in a wide range of applications. As a non-limiting example, FIG. 11 illustrates two mobile stations (MSs) 60 and 62, which represent "data sinks" in this example. It is desired to deliver Packet A and Packet B to both MSs 60 and 62 via transmission by a wireless communication network 64, which includes base stations (BSs) 66, 68, and 70.

The BS 66 receives the constituent Packet A, while the BS 68 receives the constituent Packet B. The BS 66 provides Packet A to the BS 70, while the BS 68 provides Packet B to the BS 70. BS 70 performs network coding by combining corresponding groups of information bits in Packets A and B, such that it transmits a network-coded packet representing a combination of Packets A and B to both MSs 60 and 62. (The combined packet is shown as Packet A+B, but that should be understood as a non-limiting example of a combining operation).

The BS 66 transmits Packet A to the MS 60, meaning that the MS 60 receives Packet A and Packet A+B, while the BS 68 transmits Packet B to the MS 62, meaning that the MS 62 receives Packet B and Packet A+B. Assuming that one or both of the MSs include an embodiment of the receiver circuit 12 described earlier herein, then either such MS 60 or 62 employs joint probability processing of the received constituent and network-coded packets. For example, to recover Packet B at the MS 600, the implemented embodiment of the receiver circuit 12 within the MS 60 would determine joint probabilities for the bit groups in Packet A and for the corresponding bit groups in Packet A+B, and then use a weighted combination of the corresponding joint probabilities to estimate the information bits for Packet B.

Figure 12:
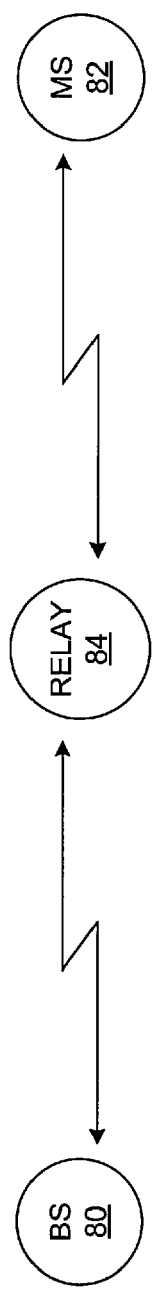
FIG. 12 is a block diagram illustrating an embodiment of joint probability processing of network coded packets at one or both of a base station and a mobile station in a wireless communication network.

FIG. 12 illustrates another non-limiting example, where a BS 80 communicates with a MS 82 through a relay 84. Here, the relay 84 is equipped for network coding and the BS 80 and the MS 82 each include an embodiment of the receiver circuit 12 for processing network coded packets using joint probabilities. To see the advantages of this scenario, consider the following operations:

at time T1: BS 80 transmits Packet A to Relay 84
at time T2: MS 82 transmit Packet B to Relay 84
at time T3: Relay 84 transmits Packet A+B to BS 80 and MS 82

Thus, rather than taking four transmission periods (e.g., symbol times) to get Packet A from the BS 80 to the MS 82 and Packet B from the MS 82 to the BS 80, network coding at the relay allows the same transfer in three symbol periods, and joint probability processing of the network-coded packets at the BS 80 and the MS 82 advantageously provides improved recovery of constituent information bits from the network-coded packets.

In the examples immediately above, or in the context of the earlier, more generic example involving the node 10, it should be understood that a given network node having an embodiment of the receiver circuit 12 as taught herein may act as a relay for a second network node, such that it receives and forwards one or more network-coded or constituent packets to the second network node. It may perform this forwarding function irrespective of whether it does or does not locally process the received packets. For example, in one embodiment, the forwarding network node may forward one or more constituent and/or network-coded packets irrespective of whether information bits recovered from the forwarded packets pass or fail error detection at the first network node. (Such packets still have value in the context of joint probability decoding because at least some of their information bits are correct.)

Taking the examples of FIGS. 11 and 12 as non-limiting illustrations, it should be understood that a mobile station having an embodiment of the receiver circuit 12 included therein can act as a relay in an ad hoc communication network, wherein it forwards one or more network-coded or constituent packets directly or indirectly to a second mobile station. Such operation can extend wireless communication network reach and flexibility, and/or can provide secondary, local communication networks between mobile stations.

Advantageously, a mobile station or other node having an embodiment of the receiver circuit 12, whether implemented in hardware, software, or a combination thereof, may be configured to request retransmission of failed packets, e.g, packets that fail error checking (such as Cyclic Redundancy Checking) only after all related packets (constituent and network-coded) have been received and joint probability processing of all or selected subsets of those packets does not resolve the decoding errors. That is, a mobile station can, as is known, be configured to detect decoding errors for the information bits determined from its received packets as the basis for sending retransmission requests from the first network node, but it can additionally be configured to defer sending retransmission requests for failed packets until all packets related to the failed packets, either as network-coded or constituent packets, have been received and used in one or more revised determinations of joint probabilities involving the detected decoding errors.

With these and other variations and extensions in mind, those skilled in the art will appreciate that the foregoing description and the accompanying drawings represent non-limiting examples of the methods and apparatus taught herein for transmit diversity coding. As such, the present invention is not limited by the foregoing description and accompanying drawings. Instead, the present invention is limited only by the following claims and their legal equivalents.

What is claimed is:

1. A method of packet decoding at a first network node comprising:
receiving a first constituent packet and a network-coded packet formed for transmission to the first network node by combining information bit groups from the first constituent packet with information bit groups from at least a second constituent packet;
generating first soft values for the information bit groups of the first constituent packet and second soft values for corresponding information bit groups of the network-coded packet based on joint probabilities of information bits within each information bit group of the first constituent packet and the network-coded packet, respectively;
generating third soft values for the information bit groups of the second constituent packet based on jointly evaluating the first and second soft values; and
recovering information bits for the second constituent packet from the third soft values.

2. The method of claim 1, wherein generating the first soft values for the information bit groups of the first constituent packet comprises determining joint log-likelihood ratios of the information bits in each information bit group of the first constituent packet, and wherein generating the second soft values for the information bit groups of the network-coded packet comprises determining joint log-likelihood ratios of the information bits in each information bit group of the network-coded packet.

3. The method of claim 2, wherein generating the first and second soft values comprises directly generating them from a soft value demodulator.

4. The method of claim 2, wherein generating the first and second soft values comprises indirectly generating them from information bit soft values demodulated for the first constituent packet and for the network-coded packet.

5. The method of claim 1, wherein generating the first and second soft values includes reducing computational complexity by considering a reduced number of highest probability hypotheses for the first and second soft values.

6. The method of claim 1, wherein generating the first and second soft values includes reducing computational complexity by considering only M highest-probability symbol hypotheses for each information bit group, and thereby storing only M symbol hypotheses and their corresponding joint probabilities per information bit group of the first constituent packet and per information bit group of the network-coded packet.

7. The method of claim 1, wherein each information bit group in the first constituent packet and in the network-coded packet represents a symbol comprising a grouping of information bits taken over a given network-coding field size, and wherein generating the first or second soft values comprises generating symbol soft values for the information bit groups being processed, based on the joint probabilities of the information bits included in the information bit groups.

8. The method of claim 1, wherein generating the third soft values for the information bit groups of the second constituent packet based on jointly evaluating the first and second soft values comprises evaluating respective probabilities for information bit combinations represented by the first and second soft values.

9. The method of claim 1, further comprising receiving a second network-coded packet that depends on the second constituent packet, and using the third soft values along with fourth soft values determined for information bit groups of the second network-coded packet to jointly determine soft values for another constituent packet on which the second network-coded packet depends.

10. The method of claim 1, wherein the first network node acts as a relay for a second network node, and further comprising forwarding one or more network-coded or constituent packets to the second network node.

11. The method of claim 10, wherein forwarding the one or more network-coded or constituent packets to the second network node includes forwarding such packets irrespective of whether information bits recovered from the forwarded packets pass or fail error detection at the first network node.

12. The method of claim 10, wherein the first network node comprises a mobile station operating as a relay in an ad hoc communication network, and wherein forwarding one or more network-coded or constituent packets to the second node comprises forwarding packets directly or indirectly to a second mobile station.

13. The method of claim 1, further comprising detecting decoding errors for the information bits determined for the first and second constituent packets as a basis for sending retransmission requests from the first network node, and deferring sending retransmission requests for either the first or second constituent packet until all packets related to either the first or second constituent packets, including any additional network-coded packets, are received at the first network node and used in one or more revised determinations of joint probabilities involving the detected decoding errors.

14. A receiver circuit configured for packet decoding at a first network node, said receiver circuit comprising one or more processing circuits configured to:
   receive a first constituent packet and a network-coded packet formed for transmission to the first network node by combining information bit groups from the first constituent packet with information bit groups from at least a second constituent packet;
   generate first soft values for the information bit groups of the first constituent packet and second soft values for corresponding information bit groups of the network-coded packet based on joint probabilities of information bits within each information bit group of the first constituent packet and the network-coded packet, respectively;
   generate third soft values for the information bit groups of the second constituent packet based on jointly evaluating the first and second soft values; and
   derive information bits for the second constituent packet from the third soft values.

15. The receiver circuit of claim 14, wherein the one or more processing circuits comprising the receiver circuit comprise one or more microprocessor-based circuits and corresponding stored program instructions.

16. The receiver circuit of claim 14, wherein the one or more processing circuits comprising the receiver circuit comprise a digital signal processor for baseband processing in a radiofrequency communications receiver.

17. The receiver circuit of claim 14, wherein the one or more processing circuits comprising the receiver circuit include a soft value decoder for generating the first and second soft values based on joint probabilities of the information bits in the information bit groups of the first constituent packet and the network-coded packet, and a joint evaluation circuit for determining the third soft values by jointly evaluating the first and second soft values.

18. The receiver circuit of claim 14 wherein the one or more processing circuits are configured to generate the first soft values for the information bit groups of the first constituent packet by determining joint log-likelihood ratios of the information bits in each information bit group of the first constituent packet, and to generate the second soft values for the information bit groups of the network-coded packet by determining joint log-likelihood ratios of the information bits in each information bit group of the network-coded packet.

19. The receiver circuit of claim 18, wherein the one or more processing circuits include a soft value demodulator configured to generate the first and second soft values as a function of joint bit probabilities of the information bits within each information bit group of the first constituent packet and the network-coded packet.

20. The receiver circuit of claim 18, wherein the one or more processing circuits are configured to generate the first and second soft values by generating them from information bit soft values demodulated for the information bit groups comprising the first constituent packet and the network-coded packet.

21. The receiver circuit of claim 14, wherein the one or more processing circuits are configured to reduce a computational complexity associated with generating the first and second soft values by considering only a reduced number of highest probability hypotheses for the first and second soft values.

22. The receiver circuit of claim 14, wherein the one or more processing circuits are configured to reduce computational complexity associated with generating the first and second soft values by considering only M highest-probability symbol hypotheses for each information bit group, and thereby storing only M symbol hypotheses and their corresponding joint probabilities per information bit group of the first constituent packet and per information bit group of the network-coded packet.

23. The receiver circuit of claim 14, wherein each information bit group in the first constituent packet and in the network-coded packet represents a symbol comprising a grouping of information bits taken over a given network-coding field size, and wherein the one or more processing circuits are configured to generate the first or second soft values by generating symbol soft values for the information bit groups being processed, based on the joint probabilities of the information bits included in those information bit groups.

24. The receiver circuit of claim 14, wherein the one or more processing circuits are configured to generate the third soft values for the information bit groups of the second constituent packet by evaluating respective probabilities for information bit combinations represented by the first and second soft values.

25. The receiver circuit of claim 14, wherein, for a second, received network-coded packet that depends on the second constituent packet, the one or more processing circuits are configured to use the third soft values along with fourth soft values determined for information bit groups of the second network-coded packet to jointly determine soft values for another constituent packet on which the second network-coded packet depends.

26. A mobile station acting as the first network node, said mobile station including the receiver circuit of claim 14.

* * * * *

UNITED STATES PATENT AND TRADEMARK OFFICE
CERTIFICATE OF CORRECTION

PATENT NO. : 8,205,140 B2
APPLICATION NO. : 11/746920
DATED : June 19, 2012
INVENTOR(S) : Hafeez et al.

Page 1 of 1

It is certified that error appears in the above-identified patent and that said Letters Patent is hereby corrected as shown below:

In Column 4, Line 19, delete "point" and insert -- (joint --, therefor.

In Column 8, Line 58, delete "600," and insert -- 60, --, therefor.

In Column 9, Line 7, delete "82" and insert -- 82. --, therefor.

In Column 12, Line 1, in Claim 18, delete "14" and insert -- 14, --, therefor.

Signed and Sealed this
Sixth Day of November, 2012

David J. Kappos
*Director of the United States Patent and Trademark Office*